United States Patent [19]

Bollinger et al.

[11] Patent Number: 5,200,358
[45] Date of Patent: Apr. 6, 1993

[54] INTEGRATED CIRCUIT WITH PLANAR DIELECTRIC LAYER

[75] Inventors: Cheryl A. Bollinger, Kutztown; Min-Liang Chen, Allentown; David P. Favreau, Coopersburg; Kurt G. Steiner, Bethlehem; Daniel J. Vitkavage, Zionsville, all of Pa.

[73] Assignee: AT&T Bell Laboratories, Murray Hill, N.J.

[21] Appl. No.: 793,070

[22] Filed: Nov. 15, 1991

[51] Int. Cl.$^5$ .............................................. H01L 21/44
[52] U.S. Cl. .................................... 437/180; 437/228; 437/238; 437/240; 437/186; 437/978

[58] Field of Search ............... 437/228, 238, 240, 180, 437/186, 978, 981

[56] References Cited

U.S. PATENT DOCUMENTS 5,037,777  8/1991  Mele et al. ........................ 437/228
5,069,747 12/1991  Cathey et al. ..................... 437/238

Primary Examiner—Brian E. Hearn
Assistant Examiner—Trung Dang
Attorney, Agent, or Firm—R. D. Laumann

[57] ABSTRACT

Self-aligned contacts are formed to regions between closely spaced features by a method which uses differential etch rates between first and second dielectrics deposited over the closely spaced features.

5 Claims, 2 Drawing Sheets

INTEGRATED CIRCUIT WITH PLANAR DIELECTRIC LAYER

TECHNICAL FIELD

This invention relates to a method of manufacturing an integrated circuit having a dielectric surface layer that has a relatively planar surface over closely spaced features.

BACKGROUND OF THE INVENTION

Relatively planar dielectric surfaces over closely spaced features are desired in many stages of integrated circuit manufacturing. Such surfaces minimize problems that might be caused by electrical discontinuities created by reentrant angles in deposited metals, limited depth of focus of steppers, etc. Unfortunately, most dielectrics are conformal in nature and are frequently deposited over nonplanar surfaces and their surfaces are similar to the underlying surfaces, i.e., they are nonplanar. The problems associated with nonplanar surfaces become more severe as device dimensions continue to decrease. The term planar surface is used to mean local planarization; i.e., the surface may be considered planar over closely spaced features, although it is not necessarily planar over the entire range of features.

A typical situation leading to a nonplanar surface involves forming an electrical contact to a narrow region located between two features such as runners. This region may be thought of as a trench, i.e., its longitudinal dimension is much greater than is its transverse dimension and the vertical dimension is relatively large. The region may be a source/drain region and the runners, which will likely have sidewalls, will now be less than a micron apart. Because of the small spacing between features and their sidewalls, the space for the contact is considerably less than a micron in the shortest direction, although it may be more than a micron in the longitudinal direction.

The small contact size makes it difficult to print the contact window accurately, and self-aligned contacts have been developed to minimize alignment problems. The runners are, for example, polysilicon covered by silicon nitride. A thin silicon oxide layer is deposited over the runners and a portion of the layer is then selectively removed after being defined lithographically to define the contact area using the nitride as an etch stop. This method is not completely satisfactory because the typical etch ratio for oxide and nitride is relatively small, for example, 2:1, and the etch may go into the polysilicon. Additionally, a nonplanar surface is left for further processing.

Even if the contact area is suitably patterned as described, problems may arise when the contact material, for example, polysilicon, is deposited and patterned. As will be readily appreciated, the polysilicon must be removed everywhere in the trench between the runners except in the contact area. It is difficult to remove the polysilicon completely from the trench. Additionally, there may be some material, i.e., resist or residue, in the trench. This material acts as an etch stop and makes accurate patterning impossible.

Other approaches to solving problems associated with nonplanar surfaces also exist. For example, a planarizing resist etchback may also be used. This suffers from several drawbacks. For example, the lack of selectivity of oxide with respect to nitride makes the opening of high aspect ratio windows difficult because nitride is likely to be removed from the tops of the runners.

It is desired to make the electrical contact with a process that can print a window having a dimension greater than the spacing between the feature.

SUMMARY OF THE INVENTION

Semiconductor integrated circuits are manufactured by a process which fabricates features on a substrate and then makes an electrical contact to the substrate in the intermediate space between the features. The features have a dielectric top layer and a conducting bottom layer. The contacts are formed by depositing first and second dielectrics over the features and the intermediate space between the features. The second dielectric etches more rapidly than does the first dielectric and has a relatively planar surface between the features. A contact window is then opened by depositing and patterning a photoresist to expose selected portions of the dielectric. The exposed dielectrics are then etched to expose selected portions of the substrate. A conductive material is deposited and patterned, if desired. The etching rate difference prevents formation of contact to the conducting bottom layer as not all of the insulating top layer is removed. Planar dielectric surfaces are maintained between the features in the areas where the contacts are not formed.

In a preferred embodiment, the first dielectric is an undoped dielectric and the second dielectric is a doped dielectric, such as BPSG or BPTEOS, or a spin-on-glass. In another preferred embodiment, the features comprise runners. In yet another preferred embodiment, an etchback is used after deposition of the second dielectric layer to clear the second dielectric layer from large areas where it is not needed.

BRIEF DESCRIPTION OF THE DRAWING

For reasons of clarity, the elements of the integrated circuit depicted are not drawn to scale. Identical numerals in different figures represent identical elements.

DETAILED DESCRIPTION

Figure 1:
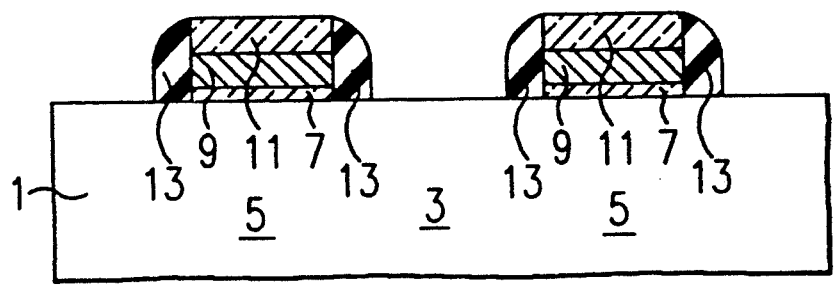
FIGS. 1-4 are sectional views of a portion of an integrated circuit at different stages in manufacturing according to one embodiment of this invention.

The invention will be described by reference to a particular embodiment which forms a buried self-aligned contact. FIG. 1 depicts substrate 1, contact region 3, and features 5. The features 5 are runners or gates which have oxide 7, conducting material 9, insulating or dielectric material 11, and sidewalls 13. The term, "substrate," is used to mean material which lies underneath and supports another material. The substrate may be a silicon wafer, either unmodified or modified by processing, such as doping, or a dielectric. The features have a dielectric top layer, a conducting bottom layer, and an oxide layer. The contact region is an intermediate space and is, e.g., a source/drain region which may be doped silicon with or without a silicide contact layer, an upper level metallization, etc. The longitudinal dimension of the intermediate space is typically much greater than is the transverse dimension, and the space may be thought of as a trench. Conducting material 9 is, e.g., polysilicon. Insulating material 11 is typically a nitride or an oxide, and the sidewalls 13 are dielectric materials, such as nitrides or oxides. For reasons of clarity, only a portion of the integrated circuit is depicted. Those skilled in the art will readily understand that additional elements are present, and will also readily fabricate the structure depicted.

Figure 2:
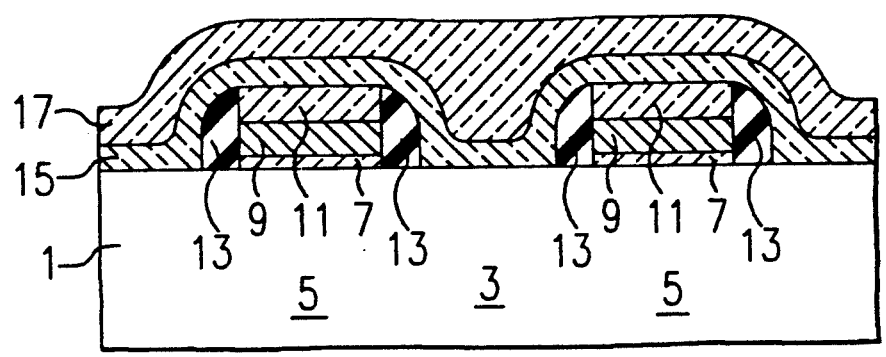

FIG. 2 depicts the structure after dielectric layers 15 and 17 have been deposited. Layers 15 and 17 comprise dielectrics which have different etch rates, with layer 17 etching more rapidly than does layer 15. Layer 15 typically comprises an undoped dielectric. This is an appropriate material to select when contacting a source/drain region of a field effect transistor. Layer 17 typically comprises a doped oxide, such as BPTEOS or BPSG, or a spin-on-glass. Materials with the required different etch rates are well known to those skilled in the art and will be readily selected. The thickness of the second dielectric is desirably controlled so that local planarity between the features is obtained during the deposition step. This process is more easily controlled if the second dielectric is deposited conformally. The structure depicted will be easily fabricated by those skilled in the art and further details are not required.

Figure 3:
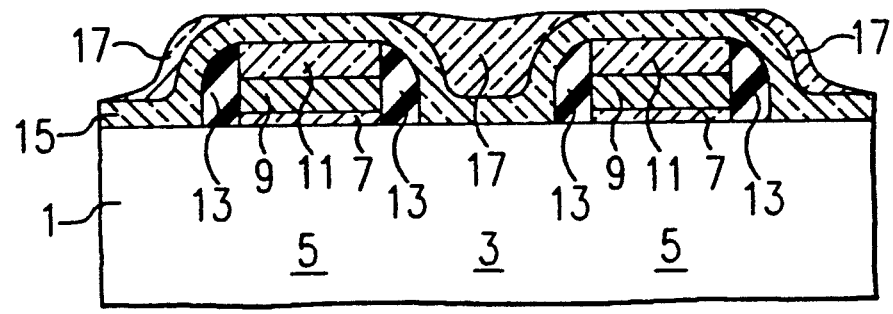

Further processing yields the structure depicted in FIG. 3. The structure has undergone a blanket etchback which removes most of the dielectric in the peripheral areas, i.e., the areas away from the features, but leaves dielectric material, with a planar surface, between the features. Some dielectric 17 is left on the outer sidewalls of the features. A photoresist layer is deposited and patterned to form an opening which exposes selected portions of the dielectric material. It should be noted that the opening is greater than the distance between the features. Smaller openings or windows can, of course, be printed. The dimension of the opening in the longitudinal direction is typically approximately the same as, or slightly greater than, the dimension depicted for the transverse dimension. The dielectric layers 15 and 17 are now etched to form windows which expose selected portions of the substrate between runners 5. The material of layer 17 etches more rapidly than does the material of layer 15 so that essentially the full space between the features and their sidewalls is exposed in the horizontal direction. The etch rate difference between the first and second dielectrics prevents removal of all of the dielectric top layer although some is removed.

Figure 4:
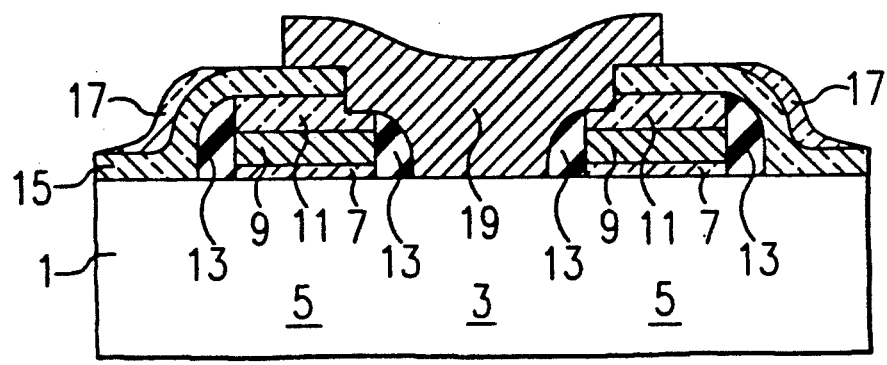

FIG. 4 shows the structure after the resist has been stripped and a layer 19 comprising conducting material, such as polysilicon deposited. A blanket deposit was used and the polysilicon was patterned to form the contact. It will be appreciated that dielectric material 17 filled the portions of the trenches between runners 5 which were under the photoresist. A planar dielectric surface is thus left for further processing.

Figure 5:
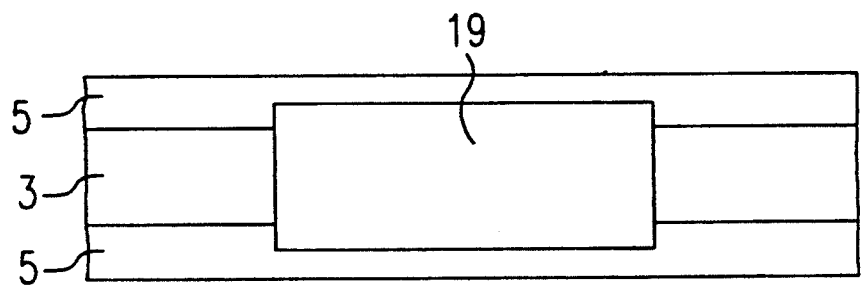
FIG. 5 is a top view of a the integrated circuit depicted in FIG. 4.

FIG. 5 is a top view of the structure depicted in FIG. 4.

Figure 6:
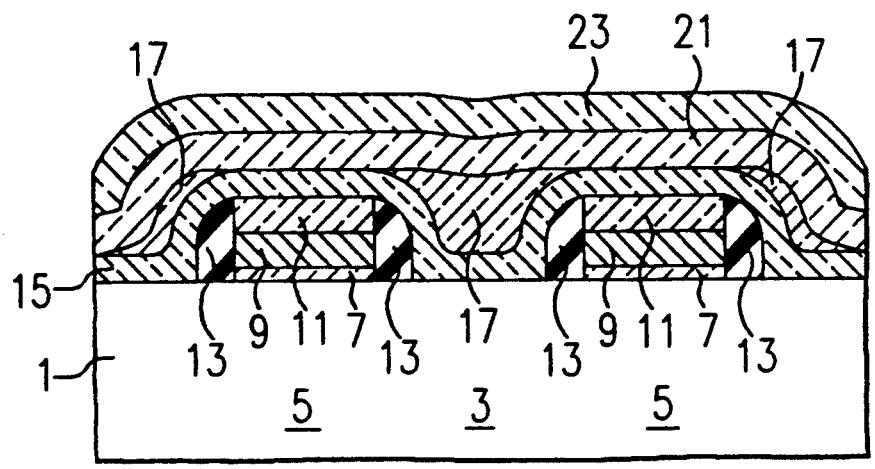
FIG. 6 is a sectional view of a portion of an integrated circuit according to one embodiment of this invention.

Further processing will include deposition of another dielectric layer. This further processing is well known to those skilled in the art. For example, an oxide layer 21 and a conductive material 23 may be deposited. The latter may be patterned to form a local interconnect which is on a planar portion of the dielectric. This structure is shown in FIG. 6.

Variations in the embodiment described will be readily apparent to those skilled in the art. For example, the contact region may be on an upper level metallization. Additionally, the features may have two materials if the oxide 7 is omitted.

We claim:

1. A method of semiconductor integrated circuit fabrication comprising the steps of fabricating spaced apart features on a substrate, said features comprising a dielectric top layer and conducting bottom layer;

and making an electrical contact to at least a portion of the substrate between the features Characterized in that said making comprises depositing first and second dielectrics over said features, etching said dielectrics with a blanket etchback after said second dielectric has been deposited, said second dielectric etching more rapidly than said first dielectric;

opening a contact window in said first and said second dielectric layers to said at least a portion of the substrate, said opening step comprises depositing and patterning a resist to form a window larger than the spacing between said features and which exposes at least a portion of said dielectrics, and etching said exposed dielectrics to reveal at least a portion of the substrate area; and electrically contacting said portion of the substrate, whereby said etching rate difference between said first and second dielectrics prevents formation of contacts to said bottom layer.

2. A method as recited in claim 1 in which said first dielectric comprises an undoped dielectric.

3. A method as recited in claim 1 in which said second dielectric comprises at least one member selected from the group consisting of BPSG, BPTEOS and spin on glasses.

4. A method as recited in claim 1 in which said first and said second dielectrics comprise conformal dielectrics.

5. A method as recited in claim 1 comprising the further step of forming local interconnects on said second dielectric.

* * * * *